United States Patent
Lee

(10) Patent No.: US 7,215,272 B2
(45) Date of Patent: May 8, 2007

(54) SCHEMES TO IMPLEMENT MULTI-LEVEL PWM IN DIGITAL SYSTEM

(76) Inventor: Ying Lau Lee, 32/F., Siu on Centre 188 Lockhart Road Wanchai, Hong Kong (HK)

( * ) Notice: Subject to any disclaimer, the term of this patent is extended or adjusted under 35 U.S.C. 154(b) by 121 days.

(21) Appl. No.: 11/103,952

(22) Filed: Apr. 12, 2005

(65) Prior Publication Data

US 2005/0231410 A1    Oct. 20, 2005

Related U.S. Application Data

(60) Provisional application No. 60/562,540, filed on Apr. 16, 2004.

(51) Int. Cl.
*H03M 1/82* (2006.01)
(52) U.S. Cl. ..................... 341/152; 341/155
(58) Field of Classification Search ............... 341/152, 341/155, 144; 375/238
See application file for complete search history.

(56) References Cited

U.S. PATENT DOCUMENTS

| | | | |
|---|---|---|---|
| 5,774,084 A * | 6/1998 | Brombaugh et al. | 341/152 |
| 6,693,571 B2 * | 2/2004 | Melanson et al. | 341/143 |
| 2002/0041246 A1 | 4/2002 | Chang et al. | 341/152 |

FOREIGN PATENT DOCUMENTS

EP    1 388 943 A1    11/2004

OTHER PUBLICATIONS

U.S. Appl. No. 10/819,573, filed Apr. 7, 2004, entitled Multi-Level Pulse Width Modulation (PWM) in Digital System, inventor Ying Lau Lee.

* cited by examiner

*Primary Examiner*—Rexford Barnie
*Assistant Examiner*—Joseph Lauture
(74) *Attorney, Agent, or Firm*—Weingarten, Schurgin, Gagnebin & Lebovici LLP

(57) ABSTRACT

A digital system employing a multi-channel and multi-level PWM technique that allows for smoother transitions in the outputs of the multiple channels in response to variations in the level of a digital input signal. The system generates PWM and other digital control signals to control switching circuitry included in the multiple channels, in which the PWM control signals are generated from a number of LSBs of the digital input signal, and the other digital control signals are generated from the remaining MSBs of the digital input signal. The system provides selected ones of the PWM and other digital control signals to each channel for controlling the switching circuitry included therein. By providing both the PWM and the other digital control signals to the multiple channels in an interleaved manner, smoother transitions in the outputs of the various channels can be achieved, thereby reducing the occurrence of unwanted transients in the system output.

70 Claims, 6 Drawing Sheets

SCHEMES TO IMPLEMENT MULTI-LEVEL PWM IN DIGITAL SYSTEM

CROSS REFERENCE TO RELATED APPLICATIONS

This application claims priority of U.S. Provisional Patent Application No. 60/562,540 filed Apr. 16, 2004 entitled SCHEMES TO IMPLEMENT MULTI-LEVEL PWM IN DIGITAL SYSTEM.

STATEMENT REGARDING FEDERALLY SPONSORED RESEARCH OR DEVELOPMENT

N/a

BACKGROUND OF THE INVENTION

The present invention relates generally to digital systems employing multi-level pulse width modulation (PWM), and more specifically to digital audio systems employing multi-level PWM to generate audio output signals from digital input signals.

U.S. patent application Ser. No. 10/819,573 filed Apr. 7, 2004 entitled MULTI-LEVEL PULSE WIDTH MODULATION (PWM) IN DIGITAL SYSTEM (the '573 application) discloses a digital system that employs PWM and other digital signals to control switching circuitry in multiple channels for generating an analog output signal from a multi-bit digital input signal. The analog output signal can be an audio sound output or any other suitable type of analog output. In one embodiment, the digital audio system controls the switching circuitry in a fixed one of the multiple channels using a PWM signal and a plurality of other digital signals, in which the PWM control signal is generated from a predetermined number of least significant bits (LSBs) of the digital input signal, and the other digital control signals are generated from the rest of the most significant bits (MSBs) of the digital input signal. The system controls the switching circuitry in the remaining channels using only the digital control signals generated from the MSBs of the digital input signal. As a result, the fixed channel provides a multi-level PWM signal that can be taken as the sum of a single-level variable-width pulse signal (the variable-width component) and a multi-level maximum-width pulse signal (the multi-level component) with a maximum pulse width at its output, while the remaining channels provide multi-level maximum-width pulse signals at their respective outputs. The signals provided at the outputs of the respective channels are typically low pass filtered before being provided to loudspeakers for producing the desired audio sound. It is noted that the maximum pulse width of a multi-level PWM signal corresponding to a PWM signal representing a first digital data value with a fixed number of binary digits, the first digital data value being the LSBs of a second digital data value represented by the multi-level PWM signal, is the theoretical width of the PWM signal when the first digital data value is increased by 1 beyond its maximum value. This theoretical width is herein referred to as the maximum pulse width reference, the maximum permissible pulse duration, or the maximum pulse duration or width of the corresponding PWM signal.

One drawback of the digital audio system disclosed in the '573 application is that when the level of the digital input signal varies from slightly above to slightly below a given level or vice versa, the PWM signal controlling the switching circuitry in the fixed channel can undergo a significant change in width, ranging from near zero to near the maximum pulse width or vice versa. This change in the width of the PWM control signal can cause a corresponding change in the variable-width component of the multi-level PWM signal provided at the output of the fixed channel. In addition, while the variable-width component of the multi-level PWM signal undergoes such a change in width, one or more of the multi-level signals provided by the remaining channels can exhibit a significant level variation. In an ideal system, such changes in the widths and/or the levels of the output signals provided by the various channels can offset one another, resulting in little or no detrimental effect on system performance. However, because the channels in a practical system can have different performance characteristics, such changes occurring in the output signals of the various channels can cause unwanted transient outputs, which are often very noticeable to the system user.

It would therefore be desirable to have a digital audio system employing multi-level PWM that avoids the drawbacks of the above-described digital audio system.

BRIEF SUMMARY OF THE INVENTION

In accordance with the present invention, a digital system employing a multi-channel and multi-level pulse width modulation (PWM) technique is disclosed that allows for smoother transitions in the outputs of the multiple channels in response to variations in the level of a digital input signal. The presently disclosed digital system generates PWM and other digital control signals to control switching circuitry included in the multiple channels, in which the PWM control signals are generated from a predetermined number of least significant bits (LSBs) of the digital input signal, and the other digital control signals are generated from a plurality of remaining most significant bits (MSBs) of the digital input signal. The digital system provides selected ones of the PWM and other digital control signals to each one of the channels for controlling the switching circuitry included therein. By providing both the PWM control signals and the other digital control signals to the multiple channels in an interleaved manner, smoother transitions in the outputs of the various channels can be achieved, thereby reducing the occurrence of unwanted transients in the system output.

In one embodiment, a digital system includes a plurality of channels, a distributed PWM signal generator, an encoder, a controller, and switching circuitry. A respective one of a plurality of multi-level electrical signals is associated with each channel. The distributed PWM signal generator generates a plurality of distributed PWM signals based on a first digital signal derived from a digital input signal. The first digital signal includes first and second digital sub-signals carrying respective LSBs and MSBs of a multi-bit value carried by the first digital signal. Each distributed PWM signal is associated with a respective one of the channels. The encoder generates a plurality of first sets of control signals based on the second digital sub-signal. Each first set of control signals is associated with a respective one of the channels. The controller includes a plurality of level selectors, each level selector being associated with a respective one of the channels and operative to assert a respective one of a second set of control signals of the respective channel in response to a respective set of the first sets of control signals and a respective one of the distributed PWM signals. The switching circuitry includes a plurality of sets of switches, in which each set of switches is associated with a respective one of the channels. Each switch in a respective set of switches is operative, in response to the assertion of a respective one of the second set of control signals for a respective one of the channels, to enable the respective set of switches to provide one of a set of distinct levels of the multi-level level electrical signal associated with that channel at a given time interval. Each one of the multi-level electrical signals provided by the sets of switches corresponds to one of a plurality of analog component outputs generated from the plurality of multi-level electrical signals. The system forms the analog output by additively combining these analog component outputs.

In another embodiment, a digital system includes a plurality of channels, a distributed PWM signal generator, an encoder, a plurality of high-level PWM converters, and switching circuitry. A respective one of a plurality of electrical signals is associated with each channel. The distributed PWM signal generator generates a plurality of distributed PWM signals based on a first digital signal derived from a digital input signal. The first digital signal includes first and second digital sub-signals carrying respective LSBs and MSBs of a multi-bit value carried by the first digital signal. Each distributed PWM signal is associated with a respective one of the channels. Each sampling cycle of the first digital signal is time divided into a high-level portion and a low-level portion, and each distributed PWM signal is within the duration of the low-level portion of a sampling cycle of the first digital signal. The encoder generates a plurality of first sets of control signals based on the second digital sub-signal. Each first set of control signals is associated with a respective one of the channels. Each high-level PWM converter associated with a respective one of the channels generates a high-level PWM signal within the duration of the high-level portion of a sampling cycle of the first digital signal based on a respective set of the first sets of control signals. The switching circuitry includes a plurality of switching stages. Each one of the switching stages is associated with a respective one of the channels. In response to the assertion of a respective one of the high-level PWM signals and a respective one of the distributed PWM signals, each switching stage generates the electrical signal associated with that channel. Each one of the electrical signals generated by the switching stages corresponds to one of a plurality of analog component outputs generated from the plurality of electrical signals. The system forms the analog output by additively combining these analog component outputs.

Other features, functions, and aspects of the invention will be evident from the Detailed Description of the Invention that follows.

BRIEF DESCRIPTION OF THE SEVERAL VIEWS OF THE DRAWINGS

The invention will be more fully understood with reference to the following Detailed Description of the Invention in conjunction with the drawings of which.

DETAILED DESCRIPTION OF THE INVENTION

U.S. Provisional Patent Application No. 60/562,540 filed Apr. 16, 2004 entitled SCHEMES TO IMPLEMENT MULTI-LEVEL PWM IN DIGITAL SYSTEM is incorporated herein by reference.

Figure 1:
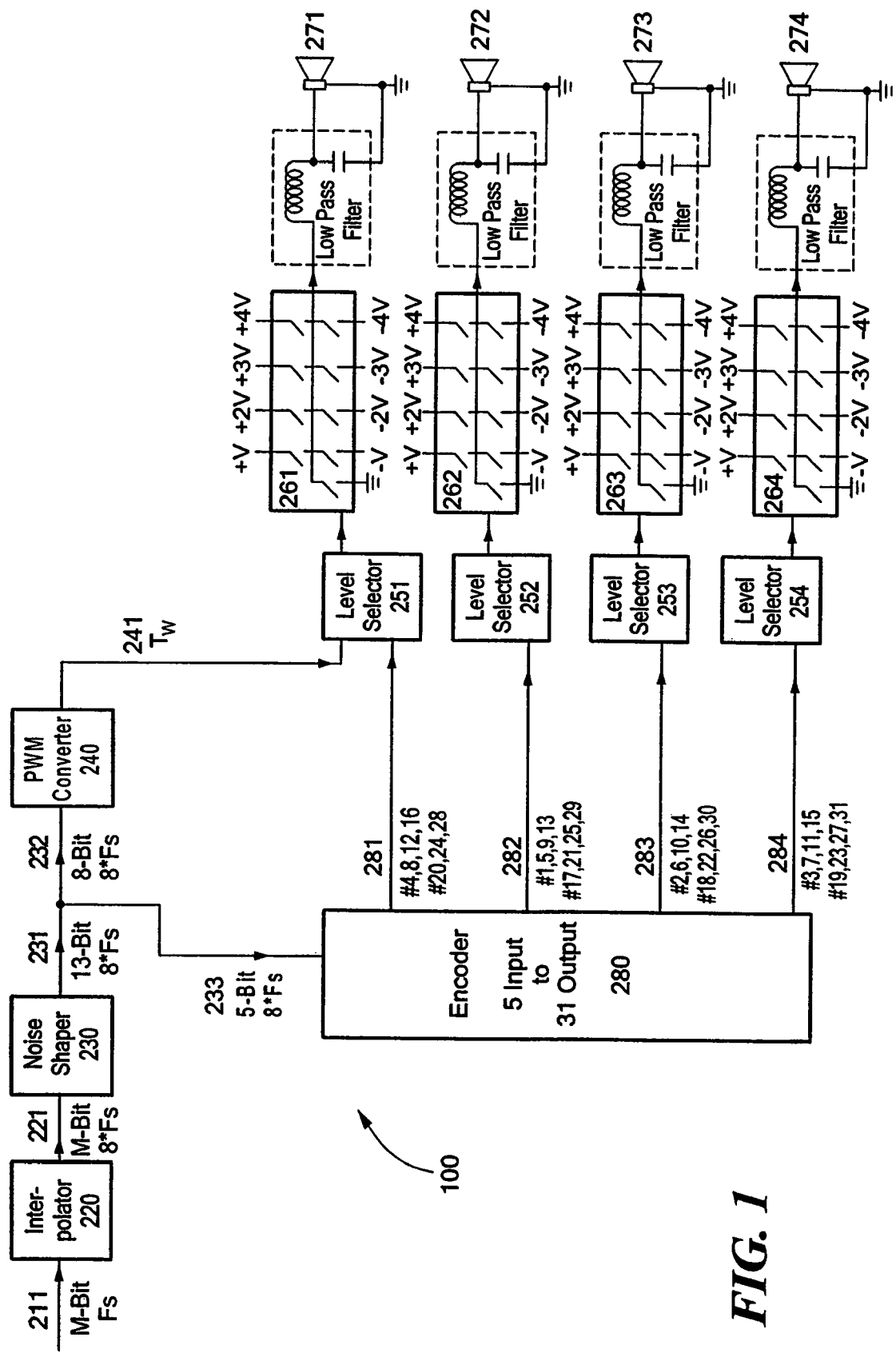
FIG. 1 is a schematic diagram of a digital audio system employing a multi-channel and multi-level pulse width modulation (PWM) technique.

FIG. 1 depicts a digital audio system 100 employing a multi-channel and multi-level pulse width modulation (PWM) technique. The digital audio system 100 is disclosed in U.S. patent application Ser. No. 10/678,614 filed Oct. 3, 2003, and U.S. patent application Ser. No. 10/819,573 filed Apr. 7, 2004, both of which are incorporated herein by reference. As shown in FIG. 1, the digital audio system 100 includes an interpolator 220, a noise shaper 230, a PWM converter 240, an encoder 280, and a plurality of channels. In the illustrated embodiment, the system 100 is a 32-level PWM digital audio system including four channels, specifically, a first channel including a level selector 251, a switching stage 261, a low pass filter, and a loudspeaker 271, a second channel including a level selector 252, a switching stage 262, a low pass filter, and a loudspeaker 272, a third channel including a level selector 253, a switching stage 263, a low pass filter, and a loudspeaker 273, and a fourth channel including a level selector 254, a switching stage 264, a low pass filter, and a loudspeaker 274. The presently disclosed system 100 employs the four channels and eight non-zero voltage levels in each channel to process an M-bit parallel input data stream 211, resulting in a resolution 32 times (or 5 bits more) the resolution that can be achieved using conventional PWM techniques with similar-speed switching devices.

More specifically, the M-bit digital input signal 211 is provided to the interpolator 220, which up-samples the M-bit data 211 to a rate X times the original input sampling rate Fs, i.e., X*Fs, to produce M-bit data 221. Next, the noise shaper 230 converts the M-bit up-sampled data 221 to coarse-quantized data 231, having a reduced resolution of Q bits at the same sampling rate X*Fs. In the illustrated embodiment, X equals 8, and Q equals 13. Each Q-bit data sample 231, which is assumed to be unsigned (signed data can be converted to unsigned data by adding an offset to it), is split into two data samples, i.e., one sample of J bits 233 (e.g., J=5) and one sample of K bits 232 (e.g., K=8), in which Q equals J+K. The J-bit sample 233 represents the most significant bits (MSBs) of the coarse-quantized Q-bit data sample 231, and the K-bit sample 232 represents the least significant bits (LSBs) of the coarse-quantized Q-bit data sample 231. The PWM converter 240 then directly converts the 8-bit data 232 into a PWM signal 241 having a pulse width Tw, and provides the PWM signal 241 to the level selector 251. It is noted that the maximum pulse width reference of the PWM signal 241 in a sampling cycle is Twmax.

The encoder 280 receives the 5-bit data signal 233, and uses it to control the states of 31 control lines in four groups 281, 282, 283, and 284. As shown in FIG. 1, the control lines are numbered 1–31. Each one of these control lines 1–31 is activated ("turned on") whenever the binary number represented by the 5-bit data 233 is greater than or equal to the number associated with the control line. For example, if a 5-bit data value "01000" is provided to the encoder 280, then the control lines 1–8 are turned on, and the remaining control lines 9–31 are deactivated ("turned off"). The PWM signal 241 and the control lines 1–31 together represent a 32-level PWM signal.

During each sampling cycle, a respective one of the level selectors 252–254 in a respective channel generates control signals to select among nine output voltage levels (e.g., 0, ±V, ±2V, ±3V, and ±4V; V=1 volt) provided by a corresponding one of the switching stages 262–264 in the same channel. The selection of the output voltage levels by the level selectors 252–254 is performed as follows. During the portion of each sampling cycle within Twmax, the base voltage level for the sampling cycle is selected based on the number of control lines that are turned on within the group 282, 283, or 284 provided to the level selector 252, 253, or 254, respectively. The condition in which no control lines are turned on corresponds to the lowest voltage level (e.g., −4 volts), and successively greater numbers of control lines turned on correspond to successively higher (i.e., more positive) voltages. During the remaining portion of each sampling cycle extending beyond Twmax, the zero voltage level (i.e., 0 volts) is selected. It is noted that the zero voltage level is also selected in the absence of the digital input signal 211.

The level selector 251 differs from the level selectors 252–254 in that it receives the signal Tw 241 in addition to the control lines in group 281. Each cycle of a pulse signal provided by the switching stage 261 has a variable-width portion having a voltage level (the pulse level) that is one level higher than the level of the other portion of that cycle within Twmax (the base level), as determined by the PWM signal Tw 241. In contrast, the switching stages 262–264 provide only maximum-width pulses (width equal to Twmax) at the base level.

As shown in FIG. 1, the control lines from the encoder 280 are grouped into the four groups as follows. Group 281 includes lines 4, 8, 12, 16, 20, 24, and 28; group 282 includes lines 1, 5, 9, 13, 17, 21, 25, and 29; group 283 includes lines 2, 6, 10, 14, 18, 22, 26, and 30; and, group 284 includes lines 3, 7, 11, 15, 19, 23, 27, and 31. Due to the interleaved nature of the groupings of the various control lines, each successively higher value of the 5-bit signal 233 causes an increase in the base level in a different channel. As a result, power is evenly distributed among the various loudspeakers 271–274.

Figure 2:
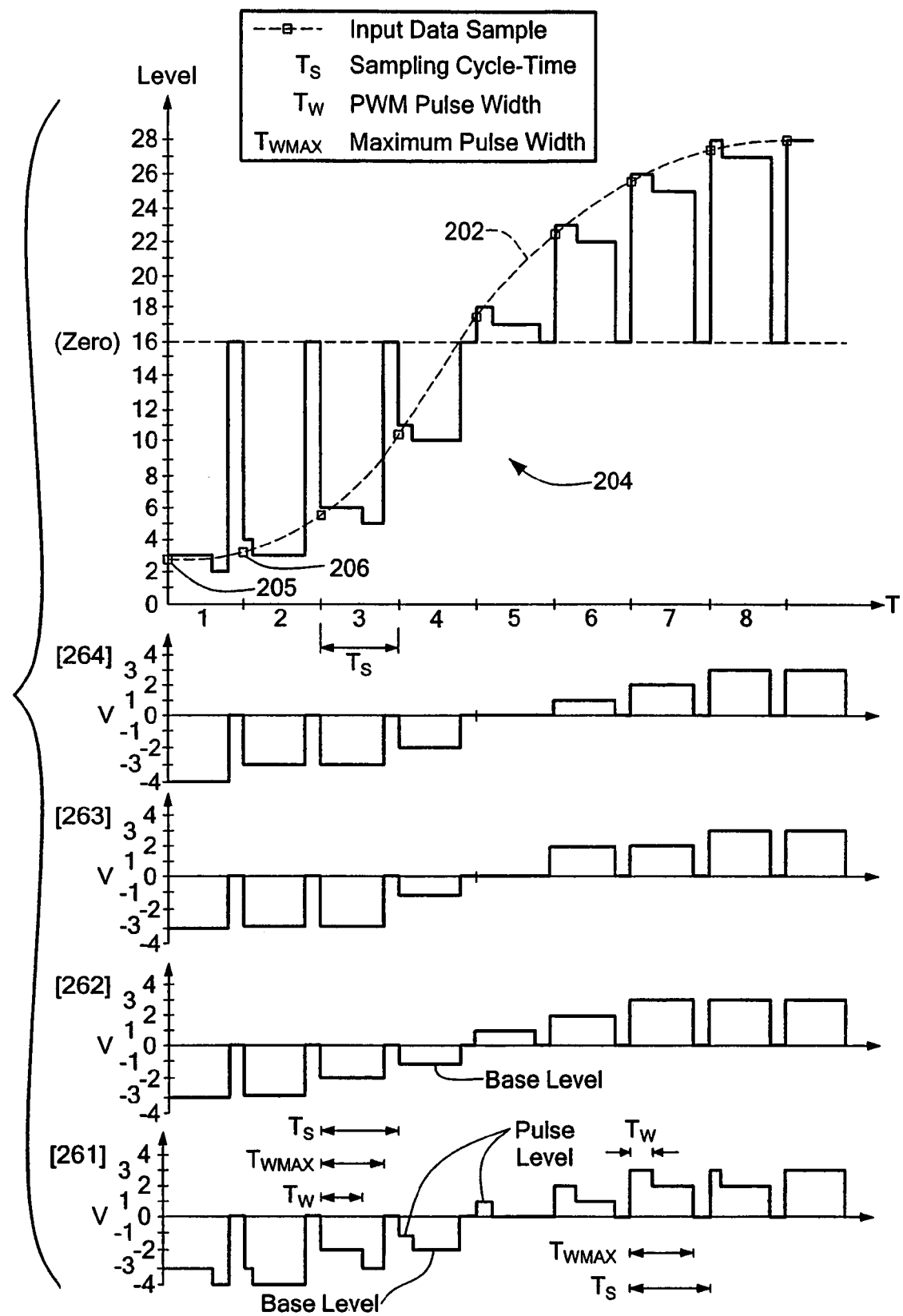
FIG. 2 is a timing diagram illustrating the operation of the digital audio system of FIG. 1.

FIG. 2 depicts representations of the signals provided by the switching stages 261–264 to the low pass filters/loudspeakers 271–274, respectively, for a particular sampled analog signal 202. The additive effect of the four channel outputs is depicted as a pulse waveform 204 superimposed on the analog signal 202. The incremental increase of the base level across the four channels is also depicted in FIG. 2. For example, from time interval 1 to time interval 2, the base level is increased from −4 volts to −3 volts in the channel including the switching stage 264, and from time interval 2 to time interval 3, the base level is increased from −3 volts to −2 volts in the channels including the switching stages 261–262.

The digital audio system 100 (see FIG. 1) produces the same acoustic effect as providing an equivalent 32-level PWM signal to a single low pass filter/loudspeaker. With the 8-bit resolution of the signal 241 provided by the PWM converter 240 and the 3-bit increase in resolution provided by the interpolator 220, the equivalent overall system resolution is 5+8+3=16 bits at the input sampling rate Fs. It is noted that the sampling period is Ts=1/Fs. For this scheme, using Y channels and a Z-voltage-level power supply to their full extent yields the equivalent of a (Y*Z)-level PWM signal.

Figure 3:
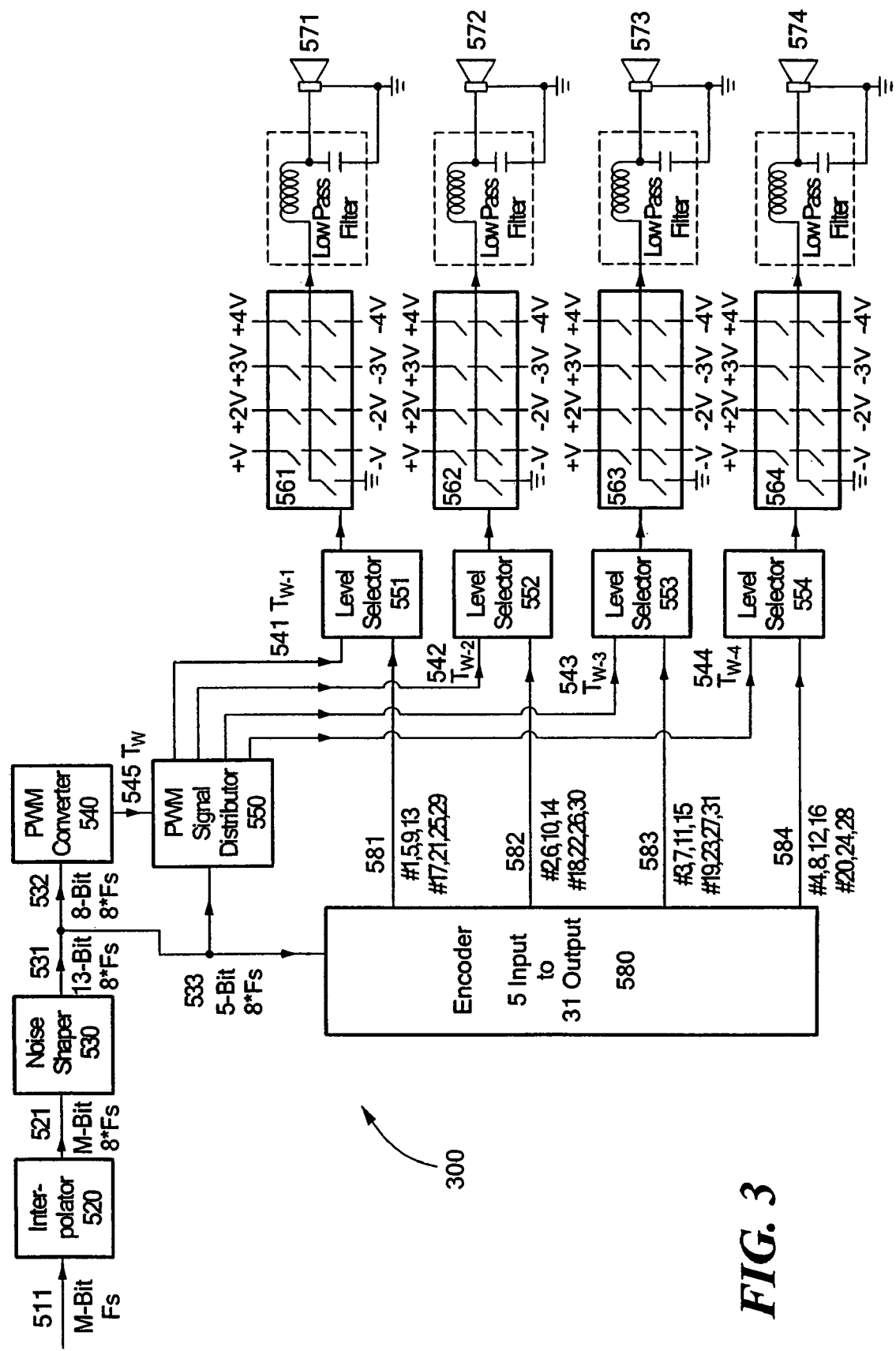
FIG. 3 is a schematic diagram of a digital audio system employing a multi-channel and multi-level PWM technique according to the present invention.

FIG. 3 depicts an illustrative embodiment 300 of a digital audio system employing a multi-channel and multi-level PWM technique, in accordance with the present invention. The digital audio system 300 employs a multi-channel multi-voltage hybrid approach to implementing multi-level PWM in a better way than the system 100 (see FIG. 1) to avoid occurrence of transients in its system output. It should be understood that the embodiment of FIG. 3 is an example to illustrate the principle and operation of the present invention.

As shown in FIG. 3, the digital audio system 300 includes an interpolator 520, a noise shaper 530, a distributed PWM signal generator including a PWM converter 540 and a PWM signal distributor 550, an encoder 580, and a plurality of channels. In the illustrated embodiment, the system 300 is a 32-level PWM digital audio system including four channels, specifically, a first channel including a level selector 551, a switching stage 561, a low pass filter, and a loudspeaker 571, a second channel including a level selector 552, a switching stage 562, a low pass filter, and a loudspeaker 572, a third channel including a level selector 553, a switching stage 563, a low pass filter, and a loudspeaker 573, and a fourth channel including a level selector 554, a switching stage 564, a low pass filter, and a loudspeaker 574.

The interpolator 520 and the noise shaper 530 operate in substantially the same way as the interpolator 220 and the noise shaper 230, respectively, of FIG. 1. Specifically, an M-bit digital input signal 511 is provided to the interpolator 520, which up-samples the M-bit data 511 to a rate X times its original sampling rate Fs, i.e., X*Fs, to produce M-bit data 521. Next, the noise shaper 530 converts the M-bit up-sampled data 521 to coarse-quantized data 531 with a reduced resolution of Q bits at the same sampling rate of X*Fs. In the illustrated embodiment, X equals 8, and Q equals 13. Each Q-bit data sample 531, which is assumed to be unsigned (signed data can be converted to unsigned data by adding an offset to it), is split into two data samples, i.e., one sample of J bits 533 (e.g., J=5) and one sample of K bits 532 (e.g., K=8), in which Q=J+K. The J-bit sample 533 represents the MSBs of the coarse-quantized Q-bit data sample 531, and the K-bit sample 532 represents the LSBs of the coarse-quantized Q-bit data sample 531.

During each sampling cycle, the PWM converter 540 directly converts the 8-bit data 532 to a PWM signal 545 having a pulse width Tw. The maximum pulse width reference of the PWM signal 545 in a sampling cycle is Twmax. The PWM converter 540 provides the PWM signal 545 to the PWM signal distributor 550, which also receives the 5-bit data stream 533. These signals are used by the PWM signal distributor 550 to generate a plurality of outputs Tw-1 541, Tw-2 542, Tw-3 543, and Tw-4 544. Specifically, the PWM signal distributor 550 distributes the PWM signal 545 to its outputs 541–544 based on the value of the 5-bit data 533. If the 5-bit data 533 is equal to 0, 4, 8, 12, 16, 20, 24 or 28, then Tw-1 541 outputs Tw 545; if the 5-bit data 533 is equal to 1, 5, 9, 13, 17, 21 , 25 or 29, then Tw-2 542 outputs Tw 545; if the 5-bit data 533 is equal to 2, 6, 10, 14, 18, 22, 26 or 30, then Tw-3 543 outputs Tw 545; and, if the 5-bit data 533 is equal to 3, 7, 11, 15, 19, 23, 27 or 31, then Tw-4 544 outputs Tw 545.

The encoder 580 receives the 5-bit data signal 533, and uses it to control the states of 31 control lines 1–31 in four groups 581–584, like the system 100 of FIG. 1. Each one of these control lines 1–31 is turned on whenever the binary number represented by the 5-bit data 533 is greater than or equal to the number associated with the control line. For example, if a 5-bit data value of "01000" is provided to the encoder 580, then the control lines 1–8 are turned on and the remaining control lines 9–31 are turned off. As shown in FIG. 3, the control lines 1–31 from the encoder 580 are grouped into four groups, namely, group 581 including lines 1, 5, 9, 13, 17, 21, 25, and 29; group 582 including lines 2, 6, 10, 14, 18, 22, 26, and 30; group 583 including lines 3, 7, 11, 15, 19, 23, 27, and 31; and, group 584 including lines 4, 8, 12, 16, 20, 24, and 28.

During each sampling cycle, each one of the level selectors 551, 552, 553, and 554 generates control signals to select among the nine output voltage levels (e.g., 0, ±V, ±2V, ±3V, and ±4V; V=1 volt) provided by the switching stage 561, 562, 563, and 564, respectively. It is noted that each cycle of a pulse signal provided by the respective switching stages 561–564 can have a variable-width portion having a voltage level (the pulse level) that is one level higher than the level of the other portion of that cycle within Twmax (the base level), as determined by the variable-width pulse signals Tw-1 541 through Tw-4 544. The selection of output voltage levels by the level selectors 551–554 is performed as follows. During the portion of each sampling cycle corresponding to the variable-width pulse of Tw-1 541, Tw-2 542, Tw-3 543, or Tw-4 544 (if any), a pulse level is selected that is one level higher than the base level for the cycle, which is determined by the number of control lines that are turned on in the group 581, 582, 583, or 584 connected to the respective level selector 551, 552, 553, or 554. Accordingly, if the base level is +2 volts, then the level +3 volts is selected during that portion of the cycle.

During the other portion of the cycle within Twmax, the level selectors 551–554 select the base level for that portion of the cycle. As described above, the base level is determined by the numbers of control lines that are turned on in the group 581, 582, 583, or 584. The condition in which no control lines are turned on corresponds to the lowest voltage level (e.g., −4 volts), and successively greater numbers of control lines turned on correspond to successively higher voltages. This portion of the cycle lasts until the end of the maximum pulse duration Twmax. During the remaining portion of each sampling cycle extending beyond Twmax, the zero voltage level is selected. It is noted that the zero voltage level is also selected in the absence of the digital input signal 511. Because each respective pulse signal provided by the switching stages 561–564 is a multi-level PWM signal, it can be viewed as the sum of a single-level variable-width pulse signal (the variable-width component) and a multi-level maximum-width pulse signal (the multi-level component) with a maximum pulse width. The variable-width component is determined by the respective variable-width pulse signals Tw-1 541 through Tw-4 544 while the multi-level component is determined by the numbers of control lines that are turned on in the respective group 581 through 584 connected to the respective level selector.

Due to the interleaved nature of the groupings of the control lines 1–31 and the distribution of the PWM signal Tw 545 among the signals Tw-1 541 through Tw-4 544, each successively higher value of the 5-bit signal 533 causes the base level to be increased in a different one of the channels, and causes the PWM signal Tw 545 to be distributed as a variable-width pulse level to a different channel. As a result, there are smoother transitions from level to level in the audio output provided by the loudspeakers 571–574 (see FIG. 3).

Figure 4:
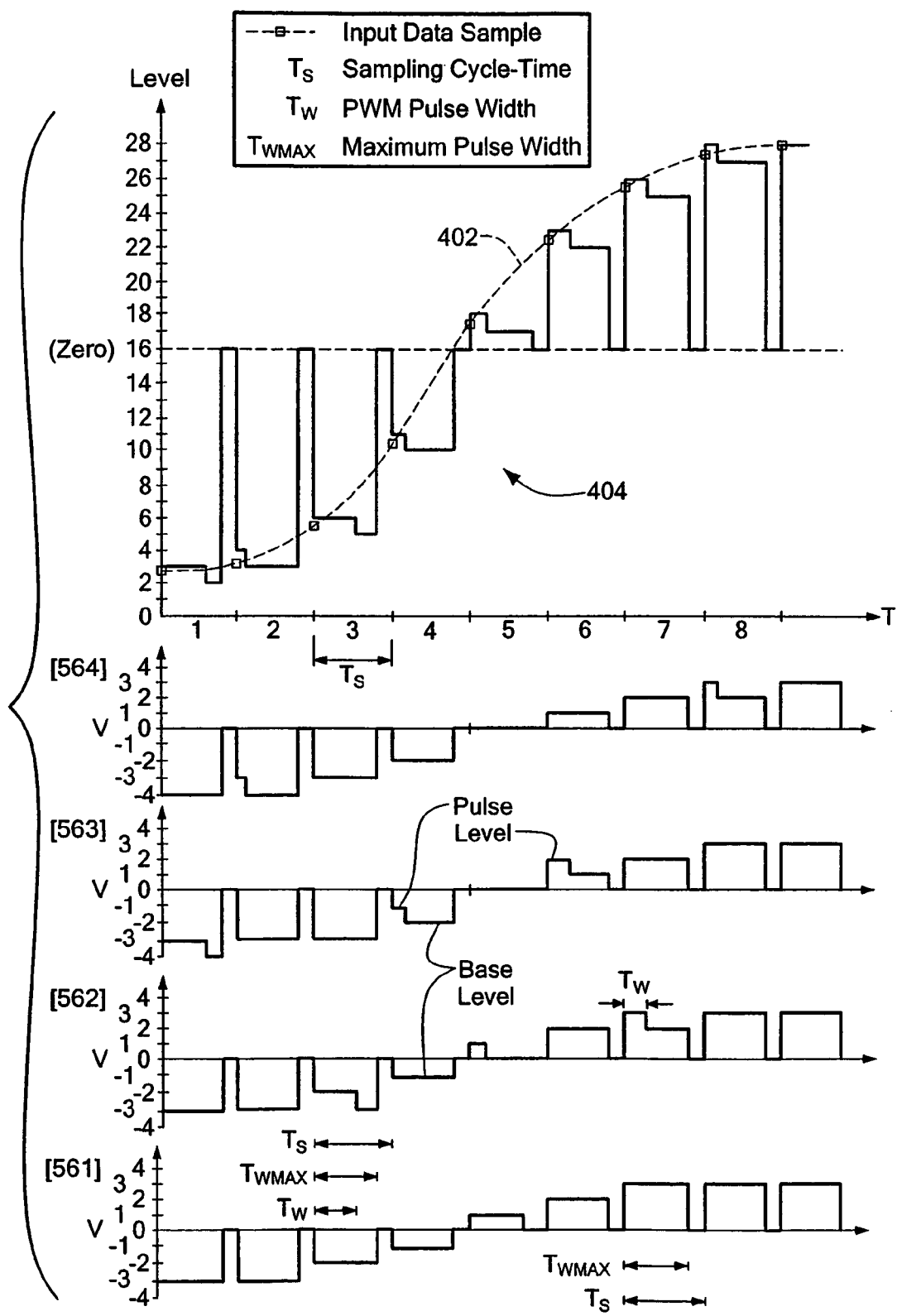
FIG. 4 is a timing diagram illustrating the operation of the digital audio system of FIG. 3.

FIG. 4 depicts representations of the signals provided by the switching stages 561–564 to the low pass filters/loudspeakers 571–574, respectively, for a particular sampled analog signal 402, which is the same as the sampled analog signal 202 (see FIG. 2). The additive effect of the four channels is depicted as a pulse waveform 404 superimposed on the analog signal 402. The incremental increase of the base level and the distribution of the variable-width pulse across the four channels are also depicted in FIG. 4. For example, from time interval 1 to time interval 2, the base level is increased from −4 volts to −3 volts in the channel including the switching stage 563, and the variable-width pulse is distributed from the channel including the switching stage 563 to the channel including the switching stage 564. Further, from time interval 2 to time interval 3, the base level is increased from −3 volts to −2 volts in the channel including the switching stage 561, the base level is increased from −4 volts to −3 volts in the channel including the switching stage 564, and the variable-width pulse is distributed from the channel including the switching stage 564 to the channel including the switching stage 562. It is noted that the pulse waveform 404 (see FIG. 4) is substantially identical to the pulse waveform 204 (see FIG. 2), and therefore the digital audio system 300 (see FIG. 3) produces substantially the same acoustic effect as the digital audio system 100 (see FIG. 1).

However, the output signals provided by the switching stages 561–564 to the low pass filters/loudspeakers 571–574, respectively (see FIG. 3), are significantly different from the output signals provided by the switching stages 261–264 to the low pass filters/loudspeakers 271–274, respectively (see FIG. 1). As shown in FIG. 2, although the magnitude of a second data sample 206 is slightly greater (i.e., more positive) than the magnitude of a first data sample 205 (i.e., the data sample 205 has a magnitude slightly less than the $3^{rd}$ voltage level, and the data sample 206 has a magnitude slightly greater than the $3^{rd}$ voltage level), from time interval 1 to time interval 2, the base level is increased from −4 volts to −3 volts in the channel including the switching stage 264, and the variable-width pulse in the channel including the switching stage 261 changes from near maximum width to near minimum width. In contrast, as shown in FIG. 4, from time interval 1 to time interval 2, the base level is increased from −4 volts to −3 volts in the channel including the switching stage 563, and the variable-width portions of the respective pulses in the channels including the switching stages 563–564 undergo relatively small changes in width. Accordingly, the digital audio system 300 provides output signals to the low pass filters/loudspeakers 571–574 (see FIG. 3) that exhibit smoother transitions from level to level than the corresponding outputs of the digital audio system 100, thereby resulting in smoother transitions in the outputs of the various channels and a concomitant reduction in unwanted transient outputs.

In one embodiment, each one of the switching stages 561–564 included in the system 300 (see FIG. 3) can be implemented with switches in a multiple H-bridge configuration, thereby allowing a designated load (i.e., a low pass filter and a loudspeaker) connected to the switches to be driven in a push-pull fashion. In such a configuration, the designated load is connected to the multiple H-bridge switches such that either a zero voltage level is applied to both ends of the load, or a positive (or negative) voltage level is applied to one end of the load and a zero voltage level is applied to the other end of the load at any given time. In this configuration, current flowing through the load in one direction represents one positive voltage level, current flowing through the load in the reverse direction represents one negative voltage level, and no current flowing through the load represents the zero voltage level. In practice, to compensate for the physical differences of the channels in the system 300, the set of voltage levels corresponding to one channel can be different from any one of the other channels.

Figure 5:
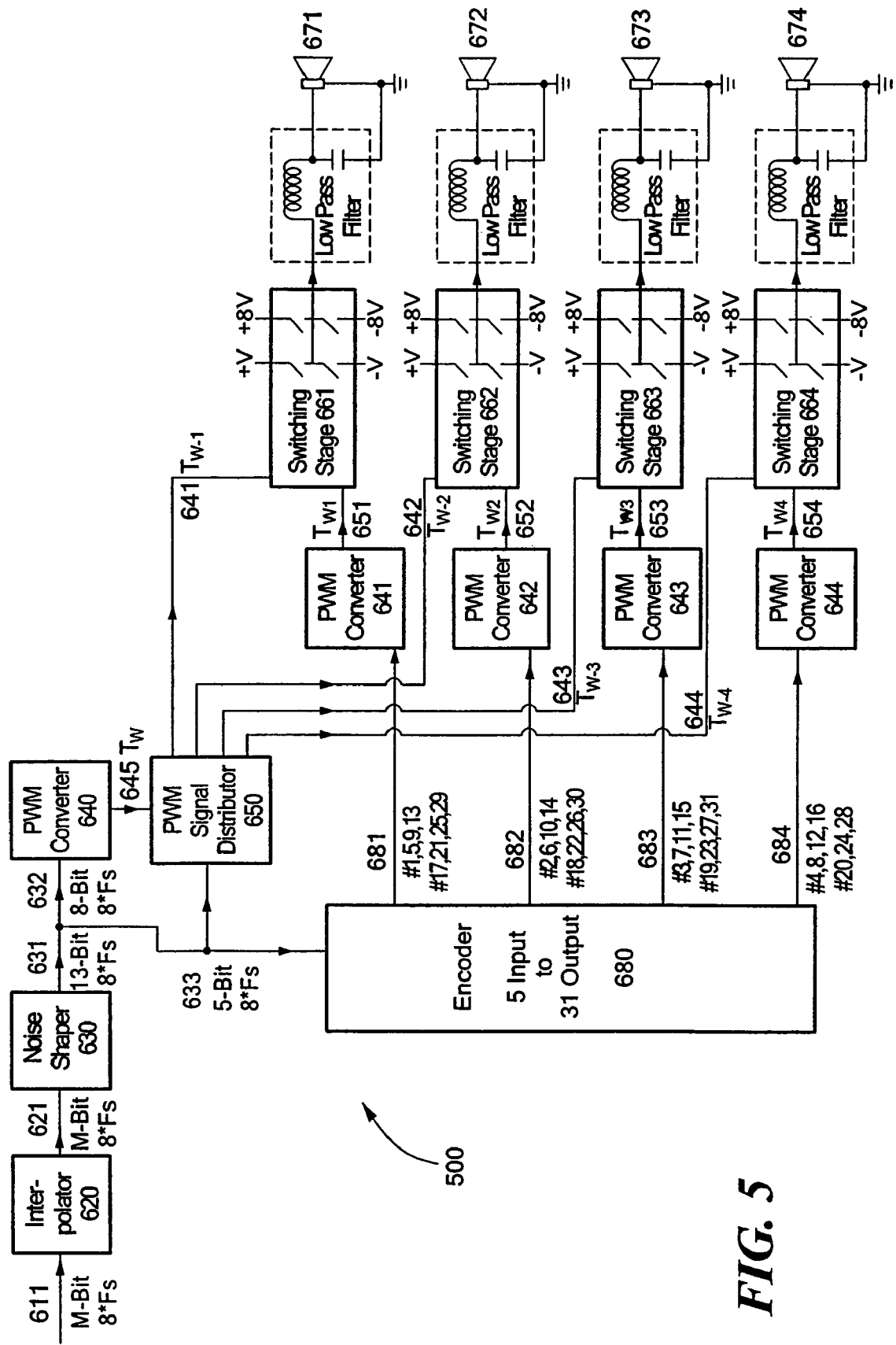
FIG. 5 is a schematic diagram of an alternative embodiment of the digital audio system of FIG. 3.

FIG. 5 depicts an alternative embodiment 500 of the digital audio system 300 of FIG. 3. Like the system 300, the digital audio system 500 employs a multi-channel multi-voltage hybrid approach to implementing multi-level PWM. It should be understood that the embodiment of FIG. 5 is an example to illustrate the principle and operation of the present invention.

In the alternative embodiment 500 of FIG. 5, each sampling cycle is time divided into two substantially equal portions. During one portion of a sampling cycle, a PWM signal representing a predetermined least significant K bits of a digital signal is used to control the output of the switching stage in one of the channels. During the other portion of the sampling cycle, the switching stage output is controlled by a PWM signal having a pulse width that varies proportionately with the number of control lines turned on in the group of control lines provided to that channel by an encoder 680 whose output is controlled by the most significant J bits of the digital signal which has J+K bits. The output of the switching stage in each channel swings between equal magnitudes of a first positive/negative voltage level during one portion of the sampling cycle, and swings between equal magnitudes of a second positive/negative voltage level during the other portion of the sampling cycle.

Figure 6:
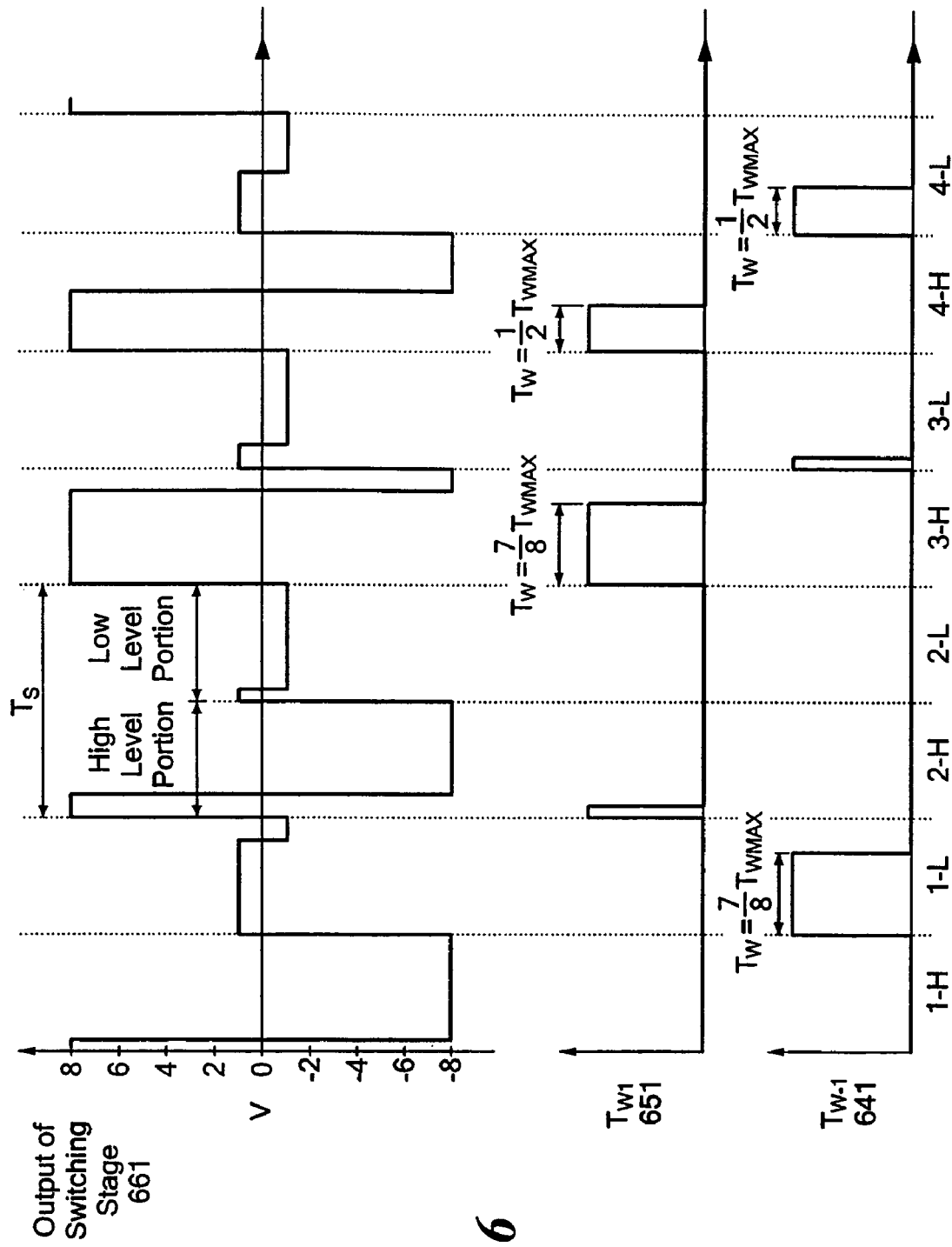
FIG. 6 is a timing diagram illustrating the operation of switching circuitry included in the digital audio system of FIG. 5.

Because the PWM signal representing the least significant K bits of the digital signal in one portion of a sampling cycle normally produces an output at a lower voltage level than that produced by the PWM signal in the other portion of the sampling cycle, the PWM signal representing the least significant K bits of the digital signal is herein referred to as the low-level PWM signal, and its corresponding portion of the sampling cycle is herein referred to as the low-level portion (see, e.g., time intervals 1-L, 2-L, 3-L, and 4-L of FIG. 6). Further, the PWM signal in the other portion of the sampling cycle is herein referred to as the high-level PWM signal, and its corresponding portion of the sampling cycle is herein referred to as the high-level portion (see, e.g., time intervals 1-H, 2-H, 3-H, and 4-H of FIG. 6).

Moreover, because the switching stage 661, 662, 663, or 664 in each channel (see FIG. 5) provides its output to a low pass filter, which effectively sums the outputs of the switching stage during the two portions of the sampling cycle, the output produced by the low-level PWM signal corresponds to the variable-width component of the outputs provided by the switching stages 561–564 (see FIG. 3), and the output produced by the high-level PWM signal corresponds to the multi-level component of the outputs provided by the switching stages 561–564 (see FIG. 3). In the illustrative embodiment 500 of FIG. 5, the high-level PWM signals operate at a level eight times higher than the low-level PWM signals (see also FIG. 6).

As shown in FIG. 5, the digital audio system 500 includes an interpolator 620, a noise shaper 630, a distributed PWM signal generator including a PWM converter 640 and a PWM signal distributor 650, the encoder 680, and a plurality of channels. In the illustrated embodiment, the system 500 is a 32-level PWM digital audio system including four channels, specifically, a first channel including a PWM converter 641, a switching stage 661, a low pass filter, and a loudspeaker 671, a second channel including a PWM converter 642, a switching stage 662, a low pass filter, and a loudspeaker 672, a third channel including a PWM converter 643, a switching stage 663, a low pass filter, and a loudspeaker 673, and a fourth channel including a PWM converter 644, a switching stage 664, a low pass filter, and a loudspeaker 674.

The interpolator 620, the noise shaper 630, the PWM converter 640, the PWM signal distributor 650, and the encoder 680 of FIG. 5 operate in substantially the same way as the interpolator 520, the noise shaper 530, the PWM converter 540, the PWM signal distributor 550, and the encoder 580, respectively, of FIG. 3. Specifically, an M-bit digital input signal 611 is provided to the interpolator 620, which up-samples the M-bit data 611 to a rate X times its original sampling rate Fs, i.e., X*Fs, to produce M-bit data 621. The noise shaper 630 converts the M-bit up-sampled data 621 to a coarse-quantized data 631 with reduced resolution of Q bits at the same sampling rate X*Fs. In the illustrated embodiment, X equals 8, and Q equals 13. Each Q-bit data sample 631, which is assumed to be unsigned (signed data can be converted to unsigned data by adding an offset to it) is split into two data samples, i.e., one sample of J bits 633 (e.g., J=5) and one sample of K bits 632 (e.g., K=8), in which Q=J+K. The J-bit sample 633 represents the MSBs of the coarse-quantized Q-bit data sample 631, and the K-bit sample 632 represents the LSBs of the coarse-quantized Q-bit data sample 631.

As described above, each sampling cycle is divided into two substantially equal portions, specifically, the low-level portion handling the K-bit sample 632 and the high-level portion handling the J-bit sample 633. During the low-level portion of each sampling cycle, the PWM converter 640 directly converts the 8-bit data 632 to a PWM signal 645 having a pulse width Tw. The maximum pulse width reference of the PWM signal 645 in the low-level portion of a sampling cycle is Twmaxl. The PWM signal 645 is provided to the PWM signal distributor 650, along with the 5-bit data stream 633. The PWM signal distributor 650 is operative to distribute the PWM signal 645 to its outputs Tw-1 641, Tw-2 642, Tw-3 643, and Tw-4 644, according to the value of the 5-bit data 633. Specifically, if the 5-bit data 633 is equal to 0, 4, 8, 12, 16, 20, 24, or 28, then Tw-1 641 outputs Tw 645; if the 5-bit data 633 is equal to 1, 5, 9, 13, 17, 21, 25, or 29, then Tw-2 642 outputs Tw 645; if the 5-bit data 633 is equal to 2, 6, 10, 14, 18, 22, 26, or 30, then Tw-3 643 outputs Tw 645; and, if the 5-bit data 633 equal to 3, 7, 11, 15, 19, 23, 27 or 31, then Tw-4 644 outputs Tw 645.

The encoder 680 receives the 5-bit data signal 633, and uses it to control the states of 31 control lines in four groups 681, 682, 683, and 684. As shown in FIG. 5, the 31 control lines are numbered 1–31. Each one of these control lines is turned on whenever the binary number represented by the 5-bit data 633 is greater than or equal to the number associated with the control line. The control lines from the encoder 680 are grouped into four groups, namely, group 681 including lines 1, 5, 9, 13, 17, 21, 25, and 29; group 682 including lines 2, 6, 10, 14, 18, 22, 26, and 30; group 683 including lines 3, 7, 11, 15, 19, 23, 27, and 31; and, group 684 including lines 4, 8, 12, 16, 20, 24, and 28.

Each one of the PWM converters 641–644 effectively converts the signals on the group of control lines provided thereto into a binary number representing the number of control lines within that group that are turned on. Next, during the high-level portion of each sampling cycle, the PWM converters 641–644 generate PWM signals Tw1 651, Tw2 652, Tw3 653, and Tw4 654, respectively, each having a pulse width increased by an amount equal to Twmaxh/N for each control line that is turned on within the group connected thereto, in which N corresponds to the number of non-zero voltage levels in the corresponding system of FIG. 3, e.g., N=8, and Twmaxh is the maximum pulse duration of the PWM signals 651–654 in the high-level portion of the sampling cycle. The condition in which no control lines are turned on corresponds to the zero pulse width, and successively greater numbers of control lines turned on correspond to successively wider pulse widths. Generally, Twmaxl multiplied by the magnitude of the low-level portion output voltage level should be equal to Twmaxh/N multiplied by the magnitude of the high-level portion output voltage level. In the illustrated embodiment, Twmaxl and Twmaxh are equal to each other and are both taken to be equal to Twmax.

The PWM signals 651–654 control the switching stages 661–664, respectively, during the high-level portion of each sampling cycle such that their electrical outputs (e.g., across each designated load for the H-bridge configuration described above) swing between equal magnitudes of a first positive/negative voltage level N*V (e.g., N=8, V=1 volt). Further, the outputs Tw-1 641, Tw-2 642, Tw-3 643, and Tw-4 644 of the PWM signal distributor 650 control the switching stages 661–664, respectively, during the low-level portion of each sampling cycle such that their electrical outputs swing between equal magnitudes of a second positive/negative voltage level V (e.g., V=1 volt).

FIG. 6 depicts a representation of the output of the switching stage 661 with reference to the signals Tw-1 641 and Tw1 651 (see also FIG. 5). As shown in FIG. 6, during the high-level portion of each sampling cycle (see, e.g., time intervals 1-H, 2-H, 3-H, and 4-H of FIG. 6), the output of the switching stage 661 swings between ±8 volts. When the digital input signal 611 is absent or the pulse width of the PWM signal Tw1 651 equals ½*Twmax, in which Twmax is the maximum pulse duration for the PWM signal 651 in the high-level portion of a sampling cycle, the output of the switching stage 661 has a 50% duty cycle in the high-level portion (see, e.g., time interval 4-H). Further, different pulse widths of the signal Tw1 651 are represented by different duty cycles of the switching stage output within the high-level portion of the sampling cycle (see, e.g., time intervals 2-H and 3-H of FIG. 6).

During the low-level portion of each sampling cycle, the output of the switching stage 661 swings between ±1 volt. When the input signal 611 is absent or the pulse width of the signal Tw-1 641 equals ½*Twmax, in which Twmax is the maximum pulse width reference of the signal TW-1 641 (or the PWM signal 645) in the low-level portion of a sampling cycle, the output of the switching stage 661 has a 50% duty cycle in the low-level portion (see, e.g., time interval 4-L). Further, different pulse widths of the signal Tw-1 641 are represented by different duty cycles of the switching stage output within the low-level portion of the sampling cycle (see, e.g., time intervals 1-L and 3-L of FIG. 6). It is appreciated that the other switching stages 662–664 operate in substantially the same way as the switching stage 661.

In practice, to compensate for the different responses of a channel to PWM signals having different magnitudes, the positive/negative voltage level outputs in the high-level portion of a sampling cycle may or may not be an exact integer multiple of the positive/negative voltage level outputs in the low-level portion of the sampling cycle. Further, the maximum pulse duration of a PWM signal within the high-level portion and/or the duration of the high-level portion of the sampling cycle may or may not be the same as the maximum pulse duration within the low-level portion and/or the duration of the low-level portion, respectively, of the sampling cycle. Moreover, to compensate for the physical differences of the channels, the output voltage levels of a channel corresponding to the high-level portion and/or the low-level portion of a sampling cycle may or may not be the same as that of the other channels. In addition, to compensate for a non-linear response of the physical system, each one of the PWM converters 640–644 may be operative for individually adjusting the width of its PWM signal in accordance with a suitable model of the output circuitry.

It is noted that the acoustic outputs provided by the loudspeakers 671–674 included in the digital audio system 500 (see FIG. 5) are substantially the same as the acoustic outputs provided by the loudspeakers 571–574 included in the digital audio system 300 (see FIG. 3). The system 500 therefore produces substantially the same acoustic effect as the system 300, which provides significantly smoother transitions of the outputs of the various channels from level to level than the digital audio system 100 (see FIG. 1).

Having described the above illustrative embodiments, other alternative embodiments or variations may be made. For example, both of the digital audio systems 300 and 500 can take advantage of the fact that a low frequency signal can be sampled at a lower rate than a high frequency signal to produce the same effective resolution. As a result, the low frequency band can employ fewer channels or loudspeakers than the higher frequency band, while maintaining the same effective resolution in the respective bands. For example, a band-separating filter can be employed to separate the digital input signal into different frequency bands, and the separate frequency bands can be processed as described above using the system 300 or 500.

In addition, the entire digital audio system 300 or 500 including the loudspeakers can be placed in a single enclosure to minimize the number of wires from the outputs of the switching stages to the respective loudspeakers.

In addition, each switching stage output provided to a respective low pass filter/loudspeaker combination can be driven by a separate power supply, in which each power supply is based on the same reference voltage level as the other power supplies. As a result, a suitable number of smaller power supplies, each dedicated to one output and effectively isolated from the other outputs, can be employed for easily producing a relatively large system output, e.g., up to 500 watts (RMS) or more. Moreover, the magnitude of the outputs of the systems 300 and 500 can be controlled by varying the power supply voltage levels in concert. This can be accomplished, for example, by varying a fixed reference voltage level upon which all of the voltage levels are based.

In addition, while the present invention may be embodied using hardware components, it is appreciated that the functions necessary to implement the invention may alternatively be embodied in whole or in part using hardware or software or some combination thereof using digital signal processors, micro-controllers, microprocessors, programmable logic arrays, or any other suitable hardware and/or software.

In addition, while the present invention is described herein with reference to a digital audio system, it is appreciated that the invention can be employed in other types of systems that generate an analog output from a digital signal representation, particularly, within systems whose performance may be constrained by the limitations of conventional PWM techniques. Accordingly, the term "analog output" should be interpreted in a broad sense to include any physical output, particularly, physical outputs that can be summed together to form a final physical output, including liquid, gaseous, thermal, electromagnetic, mechanical, acoustic, or any other suitable output.

It will further be appreciated by those of ordinary skill in the art that modifications to and variations of the above-described schemes to implement multi-level PWM in a digital system may be made without departing from the inventive concepts disclosed herein. Accordingly, the invention should not be viewed as limited except as by the scope and spirit of the appended claims.

What is claimed is:

1. A system for generating an analog output from a digital input signal, comprising:
   a plurality of channels, each channel corresponding to a respective one of a plurality of multi-level electrical signals;
   a distributed PWM signal generator operative to generate a plurality of distributed PWM signals based on a first digital signal derived from the digital input signal, the first digital signal including first and second digital sub-signals carrying a predetermined number of least significant bits (LSBs) and a plurality of remaining most significant bits (MSBs), respectively, of a multi-bit value carried by the first digital signal, each distributed PWM signal being associated with a respective one of the plurality of channels;
   an encoder operative to generate a plurality of first sets of control signals based on the second digital sub-signal, each first set of control signals being associated with a respective one of the plurality of channels;
   a controller including a plurality of level selectors, each level selector being associated with a respective one of the plurality of channels and operative to assert each one of a second set of control signals of the respective channel in response to a respective set of the plurality of first sets of control signals and a respective one of the plurality of distributed PWM signals; and
   switching circuitry including a plurality of sets of switches, each set of switches being associated with a respective one of the plurality of channels;
   wherein each switch in the set of switches of a respective one of the plurality of channels is operative in response to an assertion of a respective one of the second set of control signals of the respective channel to enable the respective set of switches to provide one of a set of distinct levels of the respective multi-level electrical signal corresponding to the channel associated therewith at a given time interval,
   wherein each one of the plurality of multi-level electrical signals provided by the plurality of sets of switches corresponds to a respective one of a plurality of analog component outputs generated from the plurality of multi-level electrical signals, and
   wherein the analog output is formed by additively combining the plurality of analog component outputs.

2. The system of claim 1 wherein the distributed PWM signal generator includes a PWM converter operative to generate a pulse width modulated signal based on the first digital sub-signal and a PWM signal distributor operative to generate the plurality of distributed PWM signals based on the pulse width modulated signal and the second digital sub-signal.

3. The system of claim 1 wherein the control signals comprising the plurality of first sets of control signals generated by the encoder in response to the second digital sub-signal are numbered consecutively starting from one and corresponding to the value of the second digital sub-signal such that all numbered control signals having a number less than or equal to the value of the second digital sub-signal are turned on else turned off and the numbered control signals are grouped by interleaving them sequentially according to the numbers assigned to them into sets to form the plurality of first sets of control signals.

4. The system of claim 3 wherein each one of the plurality of channels associated with a respective set of the plurality of first sets of control signals is assigned a number equal to the lowest number assigned to the numbered control signals comprising the respective first set of control signals,
   wherein the respective distributed PWM signal generated by the distributed PWM signal generator for a respective one of the plurality of level selectors associated with a respective one of the plurality of channels is either a pulse signal with a pulse width based on the value of the first digital sub-signal when the number resulting from adding one to the remainder left after dividing the value of the second digital sub-signal by the largest number assigned to the plurality of channels is equal to the number assigned to the respective channel or else a null signal.

5. The system of claim 1 wherein the first digital signal is the same as the digital input signal.

6. The system of claim 1 further comprising a noise shaper operative to generate the first digital signal which is coarsely quantized from the digital input signal.

7. The system of claim 1 wherein the digital input signal carries multi-bit values at a first sampling rate and the system further comprises an interpolator operative to perform interpolation based on the digital input signal to obtain the first digital signal, the first digital signal carrying multi-bit values at a second sampling rate higher than the first sampling rate.

8. The system of claim 1 wherein the digital input signal carries multi-bit values at a first sampling rate and the system further comprises:
   an interpolator operative to perform interpolation based on the digital input signal to obtain a second digital signal, the second digital signal carrying multi-bit values at a second sampling rate higher than the first sampling rate; and
   a noise shaper operative to generate the first digital signal which is coarsely quantized from the second digital signal.

9. The system of claim 1 wherein the digital input signal is a first frequency component generated from a wide-band digital signal,
   wherein each one of the plurality of analog component outputs is associated with a first frequency band associated with the first frequency component,
   wherein the plurality of analog component outputs associated with the first frequency band are additively combined to form a first frequency analog output,
   wherein the first frequency analog output and a second frequency analog output associated with a second frequency band associated with a second frequency component generated from the wide-band digital signal are additively combined to form the analog output,
   wherein a third digital signal carrying multi-bit values at a sampling rate is derived from the second frequency component,
   wherein the plurality of multi-level electrical signals are a plurality of multi-level electrical signals associated with the first frequency band,
   wherein the channels, the pulse width modulated signal, the distributed PWM signals, the PWM converter, the PWM signal distributor, the level selectors, the encoder, the switching circuitry, the controller, and the distributed PWM signal generator are first channels, a first pulse width modulated signal, first distributed PWM signals, a first PWM converter, a first PWM signal distributor, first level selectors, a first encoder, first switching circuitry, a first controller, and a first distributed PWM signal generator, respectively, associated with the first frequency band, and the system further comprises:

a band-separating filter operative to generate the first and second frequency components from the wide-band digital signal; and second switching circuitry operative to generate an electrical signal from which the second frequency analog output is generated.

10. The system of claim 9 wherein the second switching circuitry is operative in response to an assertion of a second pulse width modulated signal to generate the electrical signal from which the second frequency analog output is generated, and the system further comprises:

a second PWM converter operative to generate the second pulse width modulated signal based on the third digital signal.

11. The system of claim 9 wherein the third digital signal includes third and fourth digital sub-signals carrying a predetermined number of least significant bits and a plurality of remaining most significant bits, respectively, of a multi-bit value carried by the third digital signal, wherein the electrical signal is a multi-level electrical signal from which the second frequency analog output is generated, wherein the second switching circuitry includes a plurality of switches, each switch being operative in response to an assertion of a respective one of a fourth set of control signals to enable the second switching circuitry to provide one of a set of distinct levels of the multi-level electrical signal at a given time interval, and the system further comprises:

a second PWM converter operative to generate a second pulse width modulated signal based on the third digital sub-signal; and a second controller including a second level selector operative to assert each one of the fourth set of control signals in response to the second pulse width modulated signal and the fourth digital sub-signal.

12. The system of claim 9 wherein the third digital signal includes third and fourth digital sub-signals carrying a predetermined number of least significant bits and a plurality of remaining most significant bits, respectively, of a multi-bit value carried by the third digital signal, wherein the electrical signal is one of a plurality of multi-level electrical signals associated with the second frequency band, each multi-level electrical signal associated with the second frequency band being associated with a respective one of a plurality of second channels, the plurality of second channels being associated with the second frequency band, wherein the second frequency analog output is formed by additively combining a plurality of analog component outputs associated with the second frequency band from the plurality of second channels, each analog component output associated with the second frequency band being generated from the multi-level electrical signal of a respective one of the plurality of second channels, wherein the second switching circuitry includes a plurality of sets of switches, each set of switches being associated with a respective set of a plurality of fourth sets of control signals, each set of the plurality of fourth sets of control signals being associated with a respective one of the plurality of second channels, each switch in the set of switches of a respective one of the plurality of second channels being operative in response to an assertion of a respective one of the fourth set of control signals of the respective second channel to enable the respective set of switches to provide one of a set of distinct levels of the multi-level electrical signal of the respective second channel at a given time interval, and the system further comprises:

a second distributed PWM signal generator operative to generate a plurality of second distributed PWM signals based on the third digital signal, each second distributed PWM signal being associated with a respective one of the plurality of second channels;

a second encoder operative to generate a plurality of third sets of control signals based on the fourth digital sub-signal, each third set of control signals being associated with a respective one of the plurality of second channels; and a second controller including a plurality of second level selectors, each second level selector being associated with a respective one of the plurality of second channels and operative to assert each one of the fourth set of control signals of the respective second channel in response to a respective set of the plurality of third sets of control signals and a respective one of the plurality of second distributed PWM signals.

13. The system of claim 12 wherein the second distributed PWM signal generator includes a second PWM converter operative to generate a second pulse width modulated signal based on the third digital sub-signal, and a second PWM signal distributor operative to generate the plurality of second distributed PWM signals based on the second pulse width modulated signal and the fourth digital sub-signal.

14. The system of claim 9 wherein the third digital signal is the same as the second frequency component.

15. The system of claim 9 further comprising a noise shaper operative to generate the third digital signal which is coarsely quantized from the second frequency component.

16. The system of claim 9 wherein the second frequency component carries multi-bit values at a first sampling rate, and the system further comprises:

an interpolator operative to perform interpolation based on the second frequency component to obtain the third digital signal, the third digital signal carrying multi-bit values at a third sampling rate higher than the first sampling rate.

17. The system of claim 9 wherein the second frequency component carries multi-bit values at a first sampling rate, and the system further comprises:

an interpolator operative to perform interpolation based on the second frequency component to obtain a fourth digital signal, the fourth digital signal carrying multi-bit values at a third sampling rate higher than the first sampling rate; and a noise shaper operative to generate the third digital signal which is coarsely quantized from the fourth digital signal.

18. The system of claim 9 wherein the first frequency band is higher than the second frequency band, wherein each one of the first and second frequency bands has channels associated therewith, and wherein the first frequency band has more channels associated therewith than the second frequency band.

19. The system of claim 1 wherein the analog output is a physical output.

20. The system of claim 19 wherein the physical output is selected from the group consisting of a liquid output, a gaseous output, a thermal output, an electromagnetic output, a mechanical output, and an acoustic output.

21. The system of claim 1 wherein each one of the levels in the set of distinct levels of each electrical signal is a corresponding ratio of a reference level.

22. The system of claim 21 wherein the magnitude of the analog output is controlled by controlling the magnitude of the reference level.

23. The system of claim 1 wherein the switches in each set of switches are arranged in a multiple H-bridge configuration and are operative to apply either (1) a zero voltage level to both ends of a load connected to the switches, or (2) a positive or negative voltage level to one end of the load and a zero voltage level to the other end at any given time, such that current flowing through the load in one direction represents one positive voltage level, current flowing through the load in the reverse direction represents one negative voltage level, and no current flowing through the load represents a zero voltage level.

24. The system of claim 1 wherein the plurality of sets of switches are coupled to more than one power supply.

25. The system of claim 1 wherein the analog output is an audio signal and further including:
a plurality of low-pass filters, wherein each one of the plurality of multi-level electrical signals produced by the plurality of sets of switches is provided to a respective one of the plurality of low-pass filters, each low-pass filter providing a low-pass filtered version of a respective one of the plurality of multi-level electrical signals; and
a plurality of loudspeakers, each loudspeaker being associated with a respective one of the plurality of channels, each loudspeaker receiving the low-pass filtered version of a respective one of the plurality of multi-level electrical signals and outputting a respective one of the plurality of analog component outputs.

26. The system of claim 25 wherein the digital input signal is a first frequency component generated from a wide-band digital signal,
wherein each one of the plurality of analog component outputs is associated with a first frequency band associated with the first frequency component,
wherein the plurality of analog component outputs associated with the first frequency band are additively combined to form a first frequency audio signal,
wherein the first frequency audio signal and a second frequency audio signal associated with a second frequency band associated with a second frequency component generated from the wide-band digital signal are additively combined to form the audio signal,
wherein a third digital signal carrying multi-bit values at a sampling rate is derived from the second frequency component,
wherein the plurality of multi-level electrical signals are a plurality of multi-level electrical signals associated with the first frequency band,
wherein the channels, the loudspeakers, the low-pass filters, the pulse width modulated signal, the distributed PWM signals, the PWM converter, the PWM signal distributor, the level selectors, the encoder, the switching circuitry, the controller, and the distributed PWM signal generator are first channels, first loudspeakers, first low-pass filters, a first pulse width modulated signal, first distributed PWM signals, a first PWM converter, a first PWM signal distributor, first level selectors, a first encoder, first switching circuitry, a first controller, and a first distributed PWM signal generator, respectively, associated with the first frequency band; and
the system further comprises:
a second loudspeaker associated with the second frequency band;
a second low-pass filter coupled to the second loudspeaker;
a band-separating filter operative to generate the first and second frequency components from the wide-band digital signal; and
second switching circuitry operative to generate an electrical signal from which the second frequency audio signal is generated, the electrical signal being provided to the second low-pass filter.

27. The system of claim 26 wherein the second switching circuitry is operative in response to an assertion of a second pulse width modulated signal to generate the electrical signal from which the second frequency audio signal is generated, the second frequency audio signal being outputted by the second loudspeaker, and
the system further comprises:
a second PWM converter operative to generate the second pulse width modulated signal based on the third digital signal.

28. The system of claim 26 wherein the third digital signal includes third and fourth digital sub-signals carrying a predetermined number of least significant bits and a plurality of remaining most significant bits, respectively, of a multi-bit value carried by the third digital signal,
wherein the electrical signal is a multi-level electrical signal from which the second frequency audio signal is generated, the second frequency audio signal being outputted by the second loudspeaker,
wherein the second switching circuitry includes a plurality of switches, each switch being operative in response to an assertion of a respective one of a fourth set of control signals to enable the second switching circuitry to provide one of a set of distinct levels of the multi-level electrical signal at a given time interval, and
the system further comprises:
a second PWM converter operative to generate a second pulse width modulated signal based on the third digital sub-signal; and
a second controller including a second level selector operative to assert each one of the fourth set of control signals in response to the second pulse width modulated signal and the fourth digital sub-signal.

29. The system of claim 26 wherein the third digital signal includes third and fourth digital sub-signals carrying a predetermined number of least significant bits and a plurality of remaining most significant bits, respectively, of a multi-bit value carried by the third digital signal,
wherein the electrical signal is one of a plurality of multi-level electrical signals associated with the second frequency band, each multi-level electrical signal associated with the second frequency band being associated with a respective one of a plurality of second channels, the plurality of second channels being associated with the second frequency band,
wherein the second frequency audio signal is formed by additively combining a plurality of analog component outputs associated with the second frequency band from the plurality of second channels, each analog component output associated with the second frequency band being generated from the multi-level electrical signal of a respective one of the plurality of second channels, wherein the second loudspeaker is one of a plurality of second loudspeakers, each second loudspeaker being associated with a respective one of the plurality of second channels and outputting the analog component output corresponding to the second channel associated therewith, wherein the second low-pass filter is one of a plurality of second low-pass filters, each second low-pass filter being coupled to a respective one of the plurality of second loudspeakers, wherein each one of the plurality of multi-level electrical signals associated with the second frequency band is provided to a respective one of the plurality of second low-pass filters, wherein the second switching circuitry includes a plurality of sets of switches, each set of switches being associated with a respective one of a plurality of fourth sets of control signals, each set of the plurality of fourth sets of control signals being associated with a respective one of the plurality of second channels, each switch in the set of switches of a respective one of the plurality of second channels being operative in response to an assertion of a respective one of the fourth set of control signals of the respective second channel to enable the respective set of switches to provide one of a set of distinct levels of the multi-level electrical signal of the respective second channel at a given time interval, and the system further comprises:

a second distributed PWM signal generator operative to generate a plurality of second distributed PWM signals based on the third digital signal, each second distributed PWM signal being associated with a respective one of the plurality of second channels;

a second encoder operative to generate a plurality of third sets of control signals based on the fourth digital sub-signal, each third set of control signals being associated with a respective one of the plurality of second channels; and a second controller including a plurality of second level selectors, each second level selector being associated with a respective one of the plurality of second channels and operative to assert each one of the fourth set of control signals of the respective second channel in response to a respective set of the plurality of third sets of control signals and a respective one of the plurality of second distributed PWM signals.

30. A system for generating an analog output from a digital input signal, comprising:

a plurality of channels, each channel corresponding to a respective one of a plurality of electrical signals;

a distributed PWM signal generator operative to generate a plurality of distributed PWM signals based on a first digital signal derived from the digital input signal, the first digital signal including first and second digital sub-signals carrying a predetermined number of least significant bits and a plurality of remaining most significant bits, respectively, of a multi-bit value carried by the first digital signal, each distributed PWM signal being associated with a respective one of the plurality of channels, wherein each sampling cycle of the first digital signal is time divided into a high-level portion and a low-level portion, and wherein the plurality of distributed PWM signals are within the duration of the low-level portion of a sampling cycle of the first digital signal;

an encoder operative to generate a plurality of first sets of control signals based on the second digital sub-signal, each first set of control signals being associated with a respective one of the plurality of channels;

a plurality of high-level PWM converters, each high-level PWM converter being associated with a respective one of the plurality of channels and operative to generate a high-level PWM signal corresponding to the channel associated therewith within the duration of the high-level portion of a sampling cycle of the first digital signal based on a respective set of the plurality of first sets of control signals; and switching circuitry including a plurality of switching stages, each one of the switching stages being associated with a respective one of the plurality of channels, wherein each one of the plurality of switching stages is operative in response to assertion of a respective one of the plurality of high-level PWM signals and a respective one of the plurality of distributed PWM signals to generate the electrical signal corresponding to the channel associated therewith, wherein each one of the plurality of electrical signals generated by the plurality of switching stages corresponds to a respective one of a plurality of analog component outputs generated from the plurality of electrical signals, and wherein the analog output is formed by additively combining the plurality of analog component outputs.

31. The system of claim 30 wherein the distributed PWM signal generator includes a low-level PWM converter operative to generate a low-level PWM signal within the duration of the low-level portion of a sampling cycle of the first digital signal based on the first digital sub-signal and a PWM signal distributor operative to generate the plurality of distributed PWM signals within the duration of the low-level portion of a sampling cycle of the first digital signal based on the low-level PWM signal and the second digital sub-signal.

32. The system of claim 30 wherein each one of the plurality of electrical signals comprises a high-level electrical sub-signal and a low-level electrical sub-signal, wherein each one of the plurality of switching stages is operative to generate the high-level electrical sub-signal of a respective one of the plurality of electrical signals within the duration of the high-level portion of a sampling cycle of the first digital signal in response to an assertion of a respective one of the plurality of high-level PWM signals and to generate the low-level electrical sub-signal of a respective one of the plurality of electrical signals within the duration of the low-level portion of a sampling cycle of the first digital signal in response to an assertion of a respective one of the plurality of distributed PWM signals, wherein each high-level electrical sub-signal has two predetermined levels, and wherein each low-level electrical sub-signals has two predetermined levels.

33. The system of claim 32 wherein each high-level electrical sub-signal has two predetermined levels which are a pair of equal magnitude positive and negative voltage levels, wherein the proportions of positive and negative voltage level intervals of a corresponding one of the high-level electrical sub-signals within the duration of the high-level portion of a sampling cycle of the first digital signal corresponds to the pulse width of a corresponding one of the high-level PWM signals within the same duration, wherein each low-level electrical sub-signal has two predetermined levels which are a pair of equal magnitude positive and negative voltage levels, wherein the proportions of the positive and negative voltage level intervals of a corresponding one of the low-level electrical sub-signals within the duration of the low-level portion of a sampling cycle of the first digital signal corresponds to the pulse width of a corresponding one of the distributed PWM signals within the same duration, and wherein the magnitude of the positive and negative voltage levels of each high-level electrical sub-signal is higher than the magnitude of the positive and negative voltage levels of a corresponding low-level electrical sub-signal.

34. The system of claim 30 wherein the duration of the high-level portion and low-level portion of a sampling cycle of the first digital signal are equal in length.

35. The system of claim 30 wherein the control signals comprising the plurality of first sets of control signals generated by the encoder in response to the second digital sub-signal are numbered consecutively starting from one and corresponding to the value of the second digital sub-signal such that all numbered control signals having a number less than or equal to the value of the second digital sub-signal are turned on else turned off and the numbered control signals are grouped by interleaving them sequentially according to the numbers assigned to them into sets to form the plurality of first sets of control signals.

36. The system of claim 35 wherein each one of the plurality of channels associated with a respective set of the plurality of first sets of control signals is assigned a number equal to the lowest number assigned to the numbered control signals comprising the respective first set of control signals, wherein the respective distributed PWM signal generated by the distributed PWM signal generator for a respective one of the plurality of switching stages associated with a respective one of the plurality of channels is either a pulse signal with a pulse width based on the value of the first digital sub-signal within the duration of the low-level portion of a sampling cycle of the first digital signal when the number resulting from adding one to the remainder left after dividing the value of the second digital sub-signal by the largest number assigned to the plurality of channels is equal to the number assigned to the respective channel or else a null signal.

37. The system of claim 30 wherein the first digital signal is the same as the digital input signal.

38. The system of claim 30 further comprising a noise shaper operative to generate the first digital signal which is coarsely quantized from the digital input signal.

39. The system of claim 30 wherein the digital input signal carries multi-bit values at a first sampling rate, and the system further comprises:

an interpolator operative to perform interpolation based on the digital input signal to obtain the first digital signal, the first digital signal carrying multi-bit values at a second sampling rate higher than the first sampling rate.

40. The system of claim 30 wherein the digital input signal carries multi-bit values at a first sampling rate, and the system further comprises:

an interpolator operative to perform interpolation based on the digital input signal to obtain a second digital signal, the second digital signal carrying multi-bit values at a second sampling rate higher than the first sampling rate; and a noise shaper operative to generate the first digital signal which is coarsely quantized from the second digital signal.

41. The system of claim 30 wherein the digital input signal is a first frequency component generated from a wide-band digital signal, wherein each one of the plurality of analog component outputs is associated with a first frequency band associated with the first frequency component, wherein the plurality of analog component outputs associated with the first frequency band are additively combined to form a first frequency analog output, wherein the first frequency analog output and a second frequency analog output associated with a second frequency band associated with a second frequency component generated from the wide-band digital signal are additively combined to form the analog output, wherein a third digital signal carrying multi-bit values at a sampling rate is derived from the second frequency component, wherein the plurality of electrical signals are a plurality of electrical signals associated with the first frequency band, wherein the channels, the low-level PWM signal, the high-level PWM signals, the distributed PWM signals, the low-level PWM converter, the high-level PWM converters, the PWM signal distributor, the encoder, the switching stages, switching circuitry, and the distributed PWM signal generator are first channels, a first low-level PWM signal, first high-level PWM signals, first distributed PWM signals, a first low-level PWM converter, first high-level PWM converters, a first PWM signal distributor, a first encoder, first switching stages, first switching circuitry, and a first distributed PWM signal generator, respectively, associated with the first frequency band, and the system further comprises:

a band-separating filter operative to generate the first and second frequency components from the wide-band digital signal; and second switching circuitry operative to generate an electrical signal from which the second frequency analog output is generated.

42. The system of claim 41 wherein the second switching circuitry is operative in response to an assertion of a pulse width modulated signal to generate the electrical signal from which the second frequency analog output is generated, and the system further comprises:

a PWM converter operative to generate the pulse width modulated signal based on the third digital signal.

43. The system of claim 41 wherein the third digital signal includes third and fourth digital sub-signals carrying a predetermined number of least significant bits and a plurality of remaining most significant bits, respectively, of a multi-bit value carried by the third digital signal, wherein each sampling cycle of the third digital signal is time divided into a high-level portion and a low-level portion, wherein the second switching circuitry includes a second switching stage operative in response to an assertion of a second low-level PWM signal and a second high-level PWM signal to generate the electrical signal from which the second frequency analog output is generated, and the system further comprises:

a second low-level PWM converter operative to generate the second low-level PWM signal within the duration of the low-level portion of a sampling cycle of the third digital signal based on the third digital sub-signal; and a second high-level PWM converter operative to generate the second high-level PWM signal within the duration of the high-level portion of a sampling cycle of the third digital signal based on the fourth digital sub-signal.

44. The system of claim 41 wherein the third digital signal includes third and fourth digital sub-signals carrying a predetermined number of least significant bits and a plurality of remaining most significant bits, respectively, of a multi-bit value carried by the third digital signal, wherein each sampling cycle of the third digital signal is time divided into a high-level portion and a low-level portion, wherein the electrical signal is one of a plurality of electrical signals associated with the second frequency band, each electrical signal associated with the second frequency band being associated with a respective one of a plurality of second channels, the plurality of second channels being associated with the second frequency band, wherein the second frequency analog output is formed by additively combining a plurality of analog component outputs associated with the second frequency band from the plurality of second channels, each analog component output associated with the second frequency band being generated from the electrical signal of a respective one of the plurality of second channels, wherein the second switching circuitry includes a plurality of second switching stages, each second switching stage being associated with a respective one of the plurality of second channels and operative in response to assertion of a respective one of a plurality of second high-level PWM signals and a respective one of a plurality of second distributed PWM signals to generate the electrical signal corresponding to the second channel associated therewith, and the system further comprises:

a second distributed PWM signal generator operative to generate the plurality of second distributed PWM signals within the duration of the low-level portion of a sampling cycle of the third digital signal based on the third digital signal, each second distributed PWM signal being associated with a respective one of the plurality of second channels;

a second encoder operative to generate a plurality of second sets of control signals based on the fourth digital sub-signal, each second set of control signals being associated with a respective one of the plurality of second channels; and a plurality of second high-level PWM converters, each second high-level PWM converter being associated with a respective one of the plurality of second channels and operative to generate the second high-level PWM signal corresponding to the second channel associated therewith within the duration of the high-level portion of a sampling cycle of the third digital signal based on a respective set of the plurality of second sets of control signals.

45. The system of claim 44 wherein the second distributed PWM signal generator includes a second low-level PWM converter operative to generate a second low-level PWM signal within the duration of the low-level portion of a sampling cycle of the third digital signal based on the third digital sub-signal and a second PWM signal distributor operative to generate the plurality of second distributed PWM signals within the duration of the low-level portion of a sampling cycle of the third digital signal based on the second low-level PWM signal and the fourth digital sub-signal.

46. The system of claim 41 wherein the third digital signal is the same as the second frequency component.

47. The system of claim 41 further comprising a noise shaper operative to generate the third digital signal which is coarsely quantized from the second frequency component.

48. The system of claim 41 wherein the second frequency component carries multi-bit values at a first sampling rate, and the system further comprises:

an interpolator operative to perform interpolation based on the second frequency component to obtain the third digital signal, the third digital signal carrying multi-bit values at a third sampling rate higher than the first sampling rate.

49. The system of claim 41 wherein the second frequency component carries multi-bit values at a first sampling rate, and the system further comprises:

an interpolator operative to perform interpolation based on the second frequency component to obtain a fourth digital signal, the fourth digital signal carrying multi-bit values at a third sampling rate higher than the first sampling rate; and a noise shaper operative to generate the third digital signal which is coarsely quantized from the fourth digital signal.

50. The system of claim 41 wherein the first frequency band is higher than the second frequency band, wherein each one of the first and second frequency bands has channels associated therewith, and wherein the first frequency band has more channels associated therewith than the second frequency band.

51. The system of claim 30 wherein the analog output is a physical output.

52. The system of claim 51 wherein the physical output is selected from the group consisting of a liquid output, a gaseous output, a thermal output, an electromagnetic output, a mechanical output, and an acoustic output.

53. The system of claim 30 wherein each one of the levels of each electrical signal is a corresponding ratio of a reference level.

54. The system of claim 53 wherein the magnitude of the analog output is controlled by controlling the magnitude of the reference level.

55. The system of claim 30 wherein the plurality of switching stages are coupled to more than one power supply.

56. The system of claim 30 wherein the analog output is an audio signal and further including:

a plurality of low-pass filters, wherein each one of the plurality of electrical signals produced by the plurality of switching stages is provided to a respective one of the plurality of low-pass filters, each low-pass filter providing a low-pass filtered version of a respective one of the plurality of electrical signals; and a plurality of loudspeakers, each loudspeaker being associated with a respective one of a plurality of channels, each loudspeaker receiving the low-pass filtered version of a respective one of the plurality of electrical signals and outputting a respective one of the plurality of analog component outputs.

57. The system of claim 56 wherein the digital input signal is a first frequency component generated from a wide-band digital signal,
wherein each one of the plurality of analog component outputs is associated with a first frequency band associated with the first frequency component,
wherein the plurality of analog component outputs associated with the first frequency band are additively combined to form a first frequency audio signal,
wherein the first frequency audio signal and a second frequency audio signal associated with a second frequency band associated with a second frequency component generated from the wide-band digital signal are additively combined to form the audio signal,
wherein a third digital signal carrying multi-bit values at a sampling rate is derived from the second frequency component,
wherein the plurality of electrical signals are a plurality of electrical signals associated with the first frequency band,
wherein the channels, the loudspeakers, the low-pass filters, the low-level PWM signal, the high-level PWM signals, the distributed PWM signals, the low-level PWM converter, the high-level PWM converters, the PWM signal distributor, the encoder, the switching stages, switching circuitry, and the distributed PWM signal generator are first channels, first loudspeakers, first low-pass filters, a first low-level PWM signal, first high-level PWM signals, first distributed PWM signals, a first low-level PWM converter, first high-level PWM converters, a first PWM signal distributor, a first encoder, first switching stages, first switching circuitry, and a first distributed PWM signal generator, respectively, associated with the first frequency band, and
the system further comprises:
a second loudspeaker associated with the second frequency band;
a second low-pass filter coupled to the second loudspeaker;
a band-separating filter operative to generate the first and second frequency components from the wide-band digital signal; and
second switching circuitry operative to generate an electrical signal from which the second frequency audio signal is generated, the electrical signal being provided to the second low-pass filter.

58. The system of claim 57 wherein the second switching circuitry is operative in response to an assertion of a pulse width modulated signal to generate the electrical signal from which the second frequency audio signal is generated, the second frequency audio signal being outputted by the second loudspeaker, and
the system further comprises:
a PWM converter operative to generate the pulse width modulated signal based on the third digital signal.

59. The system of claim 57 wherein the third digital signal includes third and fourth digital sub-signals carrying a predetermined number of least significant bits and a plurality of remaining most significant bits, respectively, of a multi-bit value carried by the third digital signal,
wherein each sampling cycle of the third digital signal is time divided into a high-level portion and a low-level portion,
wherein the second switching circuitry includes a second switching stage operative in response to an assertion of a second low-level PWM signal and a second high-level PWM signal to generate the electrical signal from which the second frequency audio signal is generated, the second frequency audio signal being outputted by the second loudspeaker, and
the system further comprises:
a second low-level PWM converter operative to generate the second low-level PWM signal within the duration of the low-level portion of a sampling cycle of the third digital signal based on the third digital sub-signal; and
a second high-level PWM converter operative to generate the second high-level PWM signal within the duration of the high-level portion of a sampling cycle of the third digital signal based on the fourth digital sub-signal.

60. The system of claim 57 wherein the third digital signal includes third and fourth digital sub-signals carrying a predetermined number of least significant bits and a plurality of remaining most significant bits, respectively, of a multi-bit value carried by the third digital signal,
wherein each sampling cycle of the third digital signal is time divided into a high-level portion and a low-level portion,
wherein the electrical signal is one of a plurality of electrical signals associated with the second frequency band, each electrical signal associated with the second frequency band being associated with a respective one of a plurality of second channels, the plurality of second channels being associated with the second frequency band,
wherein the second frequency audio signal is formed by additively combining a plurality of analog component outputs associated with the second frequency band from the plurality of second channels, each analog component output associated with the second frequency band being generated from the electrical signal of a respective one of the plurality of second channels,
wherein the second loudspeaker is one of a plurality of second loudspeakers, each second loudspeaker being associated with a respective one of the plurality of second channels and outputting the analog component output corresponding to the second channel associated therewith,
wherein the second low-pass filter is one of a plurality of second low-pass filters, each second low-pass filter being coupled to a respective one of the plurality of second loudspeakers,
wherein each one of the plurality of electrical signals associated with the second frequency band is provided to a respective one of the plurality of second low-pass filters,
wherein the second switching circuitry includes a plurality of second switching stages, each second switching stage being associated with a respective one of the plurality of second channels and operative in response to assertion of a respective one of a plurality of second high-level PWM signals and a respective one of a plurality of second distributed PWM signals to generate the electrical signal corresponding to the second channel associated therewith, and
the system further comprises:
a second distributed PWM signal generator operative to generate the plurality of second distributed PWM signals within the duration of the low-level portion of a sampling cycle of the third digital signal based on the third digital signal, each second distributed PWM signal being associated with a respective one of the plurality of second channels;

a second encoder operative to generate a plurality of second sets of control signals based on the fourth digital sub-signal, each second set of control signals being associated with a respective one of the plurality of second channels; and a plurality of second high-level PWM converters, each second high-level PWM converter being associated with a respective one of the plurality of second channels and operative to generate the second high-level PWM signal corresponding to the second channel associated therewith within the duration of the high-level portion of a sampling cycle of the third digital signal based on a respective set of the plurality of second sets of control signals.

61. A method of generating an analog output from a digital input signal, comprising the steps of:

generating a plurality of distributed PWM signals based on a first digital signal derived from the digital input signal, the first digital signal including first and second digital sub-signals carrying a predetermined number of least significant bits and a plurality of remaining most significant bits, respectively, of a multi-bit value carried by the first digital signal, each distributed PWM signal being associated with a respective one of a plurality of channels;

generating a plurality of first sets of control signals based on the second digital sub-signal, each first set of control signals being associated with a respective one of the plurality of channels;

in response to assertion of a respective set of the plurality of first sets of control signals and a respective one of the plurality of distributed PWM signals, asserting a respective set of a plurality of second sets of control signals by a respective one of a plurality of level selectors, each level selector being associated with a respective one of the plurality of channels;

in response to the assertion of a respective set of the plurality of second sets of control signals, providing one of a set of distinct levels of a respective one of a plurality of multi-level electrical signals by a respective set of a plurality of sets of switches at a given time interval, each set of switches corresponding to a respective one of the plurality of channels, wherein each one of the plurality of the multi-level electrical signals provided by the plurality of sets of switches corresponds to a respective one of a plurality of analog component outputs generated from the plurality of multi-level electrical signals; and additively combining the plurality of analog component outputs to form the analog output.

62. The method of claim 61 further including the steps of:
generating a pulse width modulated signal based on the first digital sub-signal; and
generating the plurality of distributed PWM signals based on the pulse width modulated signal and the second digital sub-signal.

63. The method of claim 61 further including the steps of:
assigning consecutive numbers to a set of numbered control signals starting from one and corresponding to the value of the second digital sub-signal such that all numbered control signals having a number less than or equal to the value of the second digital sub-signal are turned on else turned off; and
grouping by interleaving the numbered control signals sequentially according to the numbers assigned to them into sets to form the plurality of first sets of control signals.

64. The method of claim 63 further including the steps of:
assigning a number to each one of the plurality of channels associated with a respective set of the plurality of first sets of control signals equal to the lowest number assigned to the numbered control signals comprising the respective first set of control signals; and
generating the respective distributed PWM signal for a respective one of the plurality of level selectors associated with a respective one of the plurality of channels such that the respective distributed PWM signal is either a pulse signal with a pulse width based on the value of the first digital sub-signal when the number resulting from adding one to the remainder left after dividing the value of the second digital sub-signal by the largest number assigned to the plurality of channels is equal to the number assigned to the respective channel or else a null signal.

65. A method of generating an analog output from a digital input signal, comprising the steps of:

generating a plurality of distributed PWM signals based on a first digital signal derived from the digital input signal, the first digital signal including first and second digital sub-signals carrying a predetermined number of least significant bits and a plurality of remaining most significant bits, respectively, of a multi-bit value carried by the first digital signal, each distributed PWM signal being associated with a respective one of a plurality of channels, wherein each sampling cycle of the first digital signal is time divided into a high-level portion and a low-level portion, and wherein the plurality of distributed PWM signals are within the duration of the low-level portion of a sampling cycle of the first digital signal;

generating a plurality of first sets of control signals based on the second digital sub-signal, each first set of control signals being associated with a respective one of the plurality of channels;

generating a plurality of high-level PWM signals based on respective sets of the plurality of first sets of control signals, each high-level PWM signal being associated with a respective one of the plurality of channels and being generated within the duration of the high-level portion of a sampling cycle of the first digital signal;

in response to assertion of a respective one of the plurality of high-level PWM signals and a respective one of the plurality of distributed PWM signals associated with a respective one of the plurality of channels, generating an electrical signal corresponding to the channel associated therewith, wherein each one of the plurality of electrical signals corresponds to a respective one of a plurality of analog component outputs generated from the plurality of electrical signals; and additively combining the plurality of analog component outputs to form the analog output.

66. The method of claim 65 wherein each one of the plurality of electrical signals comprises a high-level electrical sub-signal and a low-level electrical sub-signal, and further including the steps of:
generating the high-level electrical sub-signal of a respective one of the plurality of electrical signals within the duration of the high-level portion of a sampling cycle of the first digital signal in response to an assertion of a respective one of the plurality of high-level PWM signals; and
generating the low-level electrical sub-signal of a respective one of the plurality of electrical signals within the duration of the low-level portion of a sampling cycle of the first digital signal in response to an assertion of a respective one of the plurality of distributed PWM signals, wherein each high-level electrical sub-signal has two predetermined levels, and wherein each low-level electrical sub-signals has two predetermined levels.

67. The method of claim 66 wherein each high-level electrical sub-signal has two predetermined levels which are a pair of equal magnitude positive and negative voltage levels, wherein the proportions of positive and negative voltage level intervals of a corresponding one of the high-level electrical sub-signals within the duration of the high-level portion of a sampling cycle of the first digital signal corresponds to the pulse width of a corresponding one of the high-level PWM signals within the same duration, wherein each low-level electrical sub-signal has two predetermined levels which are a pair of equal magnitude positive and negative voltage levels, wherein the proportions of the positive and negative voltage level intervals of a corresponding one of the low-level electrical sub-signals within the duration of the low-level portion of a sampling cycle of the first digital signal corresponds to the pulse width of a corresponding one of the distributed PWM signals within the same duration, and wherein the magnitude of the positive and negative voltage levels of each high-level electrical sub-signal is higher than the magnitude of the positive and negative voltage levels of a corresponding low-level electrical sub-signal.

68. The method of claim 65 further including the steps of:

generating a pulse width modulated signal based on the first digital sub-signal; and generating the plurality of distributed PWM signals based on the pulse width modulated signal and the second digital sub-signal.

69. The method of claim 65 further including the steps of:

assigning consecutive numbers to a set of numbered control signals starting from one and corresponding to the value of the second digital sub-signal such that all numbered control signals having a number less than or equal to the value of the second digital sub-signal are turned on else turned off; and grouping by interleaving the numbered control signals sequentially according to the numbers assigned to them into sets to form the plurality of first sets of control signals.

70. The method of claim 69 further including the steps of:

assigning a number to each one of the plurality of channels associated with a respective set of the plurality of first sets of control signals equal to the lowest number assigned to the numbered control signals comprising the respective first set of control signals; and generating the respective distributed PWM signal for a respective one of the plurality of switching stages associated with a respective one of the plurality of channels such that the respective distributed PWM signal is either a pulse signal with a pulse width based on the value of the first digital sub-signal within the duration of the low-level portion of a sampling cycle of the first digital signal when the number resulting from adding one to the remainder left after dividing the value of the second digital sub-signal by the largest number assigned to the plurality of channels is equal to the number assigned to the respective channel or else a null signal.

* * * * *